US012573815B2

(12) United States Patent
Nakamura

(10) Patent No.: US 12,573,815 B2
(45) Date of Patent: Mar. 10, 2026

(54) SEMICONDUCTOR LASER FOR PREVENTING HOLE BURNING EFFECT

(71) Applicant: Lumentum Japan, Inc., Sagamihara (JP)

(72) Inventor: Atsushi Nakamura, Komoro (JP)

(73) Assignee: Lumentum Japan, Inc., Kanagawa (JP)

( * ) Notice: Subject to any disclaimer, the term of this patent is extended or adjusted under 35 U.S.C. 154(b) by 641 days.

(21) Appl. No.: 18/057,979

(22) Filed: Nov. 22, 2022

(65) Prior Publication Data

US 2024/0022042 A1    Jan. 18, 2024

(30) Foreign Application Priority Data

Jul. 13, 2022    (JP) ................................. 2022-112724
Sep. 14, 2022    (JP) ................................. 2022-146157

(51) Int. Cl.
*H01S 5/0625*    (2006.01)
*H01S 5/028*    (2006.01)
*H01S 5/12*    (2021.01)
*H01S 5/183*    (2006.01)

(52) U.S. Cl.
CPC ........ *H01S 5/06258* (2013.01); *H01S 5/0287* (2013.01); *H01S 5/124* (2013.01); *H01S 5/1835* (2013.01)

(58) Field of Classification Search
CPC .... H01S 5/06258; H01S 5/0287; H01S 5/124;
H01S 5/1835; H01S 5/1203; H01S 5/2275; H01S 5/168; H01S 5/2224; H01S 5/04254; H01S 5/1053; H01S 5/2231; H01S 2301/176
See application file for complete search history.

(56) References Cited

U.S. PATENT DOCUMENTS

| | | | | |
|---|---|---|---|---|
| 5,052,015 A | * | 9/1991 | Ackerman | ................ H01S 5/10 |
| | | | | 372/96 |
| 5,170,402 A | * | 12/1992 | Ogita | ...................... H01S 5/227 |
| | | | | 372/50.1 |
| 5,321,716 A | * | 6/1994 | Kinoshita | ........... H01S 5/04254 |
| | | | | 372/50.11 |
| 5,363,399 A | * | 11/1994 | Yagi | ..................... H01S 5/1228 |
| | | | | 372/96 |
| 2002/0037024 A1 | | 3/2002 | Huang | |
| 2004/0125851 A1 | * | 7/2004 | Park | ...................... H01S 5/1228 |
| | | | | 372/50.22 |
| 2008/0219315 A1 | * | 9/2008 | Makino | ..................... H01S 5/12 |
| | | | | 372/50.1 |
| 2010/0081224 A1 | * | 4/2010 | Yanagisawa | .............. H01S 5/12 |
| | | | | 264/2.7 |

(Continued)

FOREIGN PATENT DOCUMENTS

JP        H05-259573 A        10/1993
JP        2002-084033 A        3/2002

*Primary Examiner* — Xinning(Tom) Niu

(74) *Attorney, Agent, or Firm* — Harrity & Harrity, LLP

(57) ABSTRACT

Provided is a semiconductor laser that includes: an active layer; a grating layer including a phase shift portion with partially different grating periods; a contact layer placed above the grating layer; a highly resistive element higher in electric resistance than the contact layer; and an electrode in contact with the contact layer, and the highly resistive element is below at least a part of a portion of the electrode that overlaps with the phase shift portion.

20 Claims, 17 Drawing Sheets

(56)　　　　　　References Cited

U.S. PATENT DOCUMENTS

2010/0327257  A1*  12/2010  Yamamoto ................ H01S 5/12
　　　　　　　　　　　　　　　　　　　　　　438/31
2016/0276803  A1*   9/2016  Uesaka ............... H01S 5/06258

* cited by examiner

501

SEMICONDUCTOR LASER FOR PREVENTING HOLE BURNING EFFECT

CROSS-REFERENCE TO RELATED APPLICATIONS

The present application claims priority from Japanese patent applications 2022-146157 filed on Sep. 14, 2022 and 2022-112724 filed on Jul. 13, 2022, the contents of which are hereby incorporated by reference into this application.

TECHNICAL FIELD

The present invention relates to a semiconductor laser and method of manufacturing the same.

BACKGROUND

Semiconductor lasers are widely used as light sources for use in optical communication. One such semiconductor laser is a distributed feedback laser (DFB laser). The DFB laser includes a diffraction grating, which can include a phase shift portion in order to improve one or more characteristics.

SUMMARY

In a DFB laser that has a grating including a phase shift portion, a hole burning effect occurs in the phase shift portion in some cases. The hole burning effect is a phenomenon in which one region has a concentratedly high light intensity, and is accordingly larger in stimulated emission of light, smaller in number of carriers, and lower in gain than other regions. As a result, the hole burning effect leads to degradation in characteristics of the semiconductor laser. For example, the hole burning effect causes a spectral line width to increase. When the magnitude of the hole burning effect is significant, single-mode oscillation cannot be maintained. Here, an influence of the hole burning effect in a direction in which the grating is aligned is discussed, and this type of hole burning effect is also called "axial hole burning."

Some implementations described herein are directed to suppressing axial hole burning of a semiconductor laser that has a grating including a phase shift portion.

In some implementations, there is provided a semiconductor laser including: an active layer; a grating layer including a phase shift portion with partially different grating periods; a contact layer placed above the grating layer; a highly resistive element higher in electric resistance than the contact layer; and an electrode in contact with the contact layer, the highly resistive element being placed below at least a part of a portion of the electrode that overlaps with the phase shift portion.

In some implementations, there is provided a method of manufacturing a semiconductor laser, the method including: forming an active layer; forming a grating layer including a phase shift portion with partially different grating periods; forming a contact layer above the grating layer; forming a highly resistive element higher in electric resistance than the contact layer; and forming an electrode in contact with the contact layer, the highly resistive element being placed below at least a part of a portion of the electrode that overlaps with the phase shift portion.

In some implementations, a semiconductor laser having excellent characteristics is provided.

DETAILED DESCRIPTION

Figure 1:
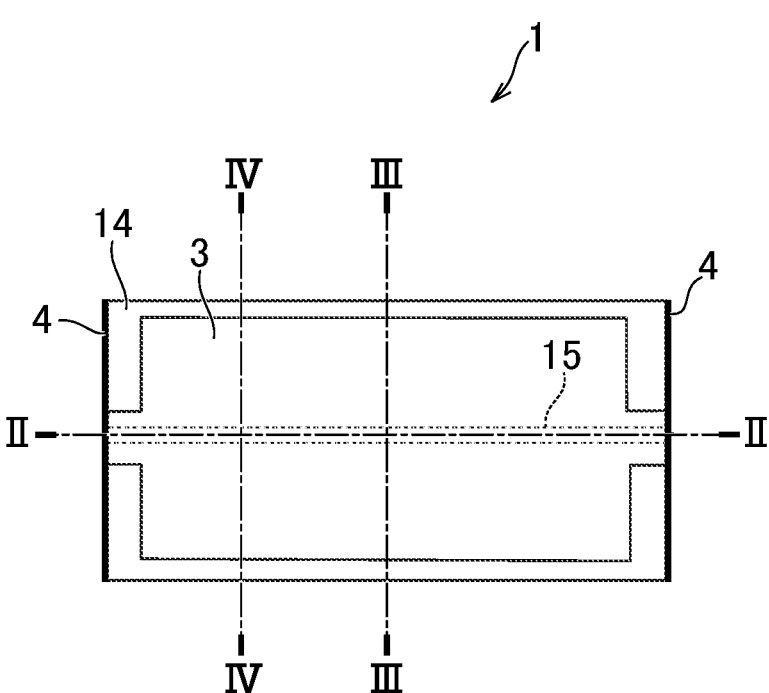
FIG. 1 is an example of a top view of a semiconductor laser according to a first example implementation of the present invention.

Some implementations are specifically described in detail in the following with reference to drawings. In the drawings, the same members are denoted by the same reference numerals and have the same or equivalent functions, and a repetitive description thereof may be omitted for the sake of simplicity. Note that, the drawings referred to in the following are only for illustrating the example implementations, and are not necessarily drawn to scale.

Figure 2:
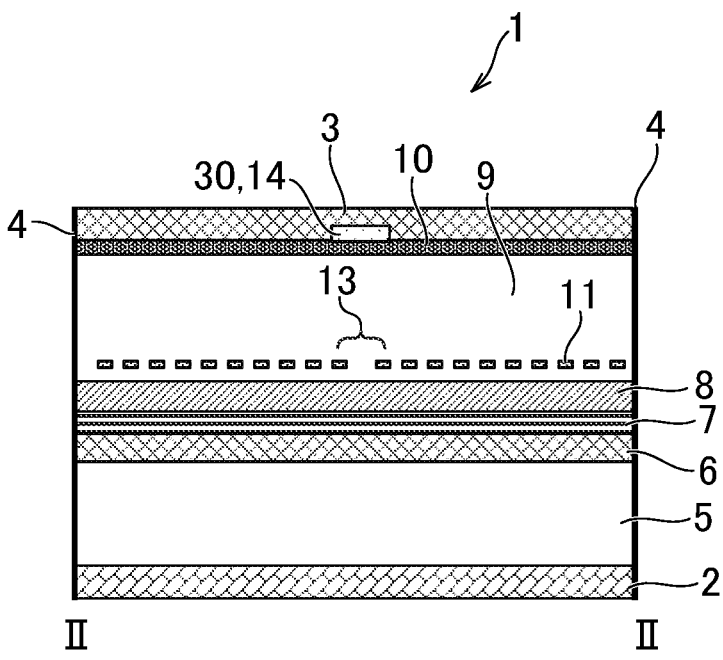
FIG. 2 is a schematic sectional view taken along the line II-II of the semiconductor laser illustrated in FIG. 1.
Figure 3:
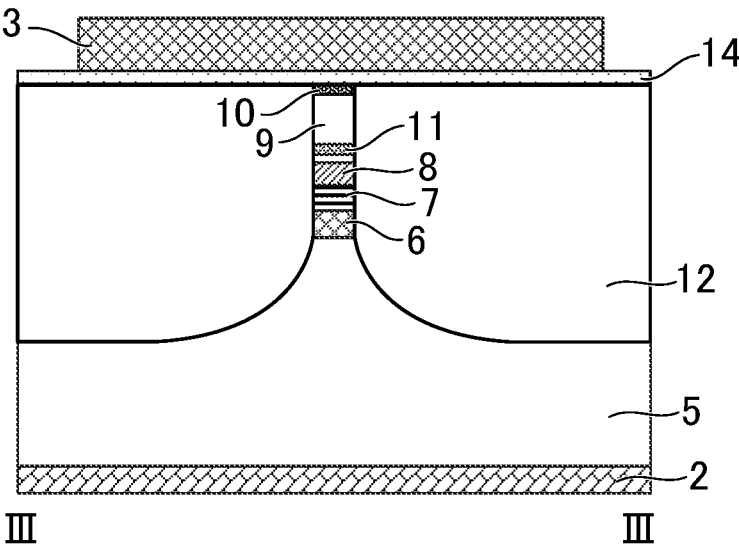
FIG. 3 is a schematic sectional view taken along the line of the semiconductor laser illustrated in FIG. 1.
Figure 4:
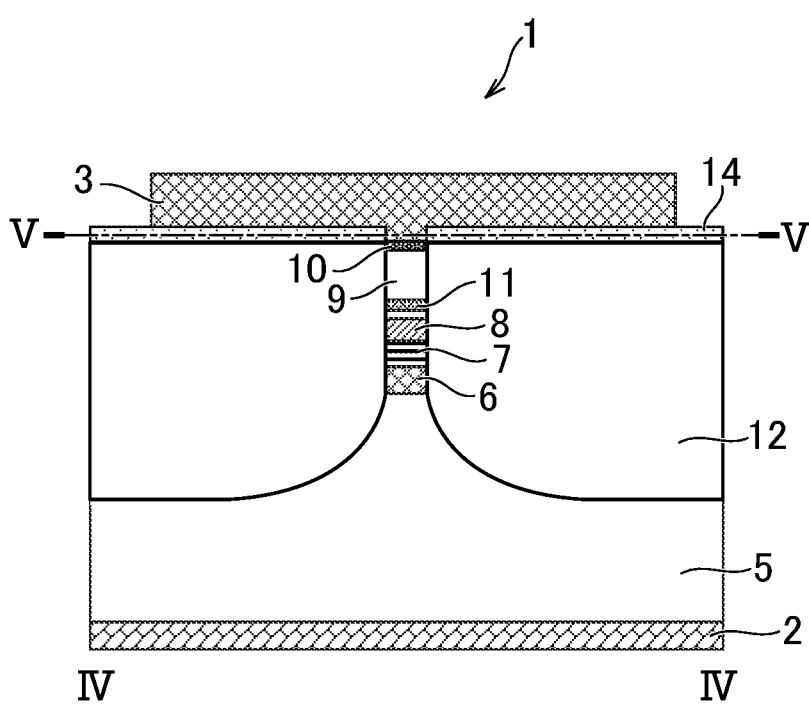
FIG. 4 is a schematic sectional view taken along the line IV-IV of the semiconductor laser illustrated in FIG. 1.

FIG. 1 is a top view of a semiconductor laser 1 according to a first example implementation of the present invention. FIG. 2 is a schematic sectional view taken along the line II-II of FIG. 1. FIG. 3 is a schematic sectional view taken along the line of FIG. 1. FIG. 4 is a schematic sectional view taken along the line IV-IV of FIG. 1. The semiconductor laser 1 may include a first electrode 2 on a rear surface and may have a second electrode 3 on a front surface. The first electrode 2 and the second electrode 3 may be metal layers. Injection of a current between the first electrode 2 and the second electrode 3 causes light emission from a front facet (a facet on a left-hand side in FIG. 1). A low-reflection facet coating film 4 may be formed on each of the front facet and a back facet (a facet on a right-hand side in FIG. 1).

The semiconductor laser 1 may include an optical confinement layer (e.g., a separate confinement heterostructure (SCH) layer) 6 of a first-conductivity type, an active layer 7, an optical confinement layer (e.g., an SCH layer) 8 of a second-conductivity type, a cladding layer 9 of the second-conductivity type, and a contact layer 10 of the second-conductivity type, which may be semiconductor layers grown on a substrate 5 of the first-conductivity type in the stated order. A grating layer 11 may be formed in the cladding layer 9 of the second-conductivity type. The semiconductor laser 1 may be a DFB laser. The active layer 7 may be formed from, for example, a multiple quantum well layer. The multiple quantum well layer may be a layer of an intrinsic semiconductor or an n-type semiconductor. Here, the first-conductivity type may be an "n" type and the second-conductivity type may be a "p" type, but may be vice versa. Those semiconductor layers also may have a mesa structure 15. The mesa structure 15 stretches along a direction from which light may be extracted. A lower portion of the mesa structure 15 may be a part of the substrate 5. The mesa structure 15 may be covered, on both sides, with a buried layer 12, which may be semi-insulating. The buried layer 12 may be a multilayer of p-type and n-type semiconductor layers. The dotted lines of FIG. 1 indicate positions of boundaries between a top portion of the mesa structure 15 and the buried layer 12.

The grating layer 11 may include a phase shift portion with partially different grating periods. The grating layer 11 may be arranged in the direction along which the mesa structure 15 stretches. The grating layer 11 may have a constant grating period, but may include a phase shift portion 13 in a substantially central portion viewed from the direction along which the mesa structure 15 stretches. The phase shift portion 13 here may be a λ/4 phase shift portion.

The semiconductor laser 1 may include an insulating film 14 on the front surface. The insulating film 14 covers the front surface of the semiconductor laser 1 except for a part of the semiconductor laser 1. The insulating film 14 may not be placed on the mesa structure 15 with an exception of a region above the phase shift portion 13. In other words, the insulating film 14 may be placed in a region that overlaps with the phase shift portion 13, and a region in which the mesa structure 15 may not be formed. A portion of the insulating film 14 that may be placed in the region overlapping with the phase shift portion 13 may be a highly resistive element 30. Although the highly resistive element 30 may be a part of the insulating film here, different materials may be used for the highly resistive element 30 and regions of the insulating film 14 other than the highly resistive element 30. Examples of other materials are described elsewhere herein. The highly resistive element 30 may be higher in electric resistance than the contact layer 10 of the second-conductivity type. Here, the entirety of the insulating film 14 including the highly resistive element 30 may be, for example, an oxide film or a nitride film. In the region above the mesa structure 15 in which the insulating film 14 may not be placed, the second electrode 3 and the contact layer 10 of the second-conductivity type may be electrically and physically in contact with each other. In a mode illustrated in FIG. 2, the electrode 3 may be in contact with the contact layer 10 of the second-conductivity type in front of and behind the highly resistive element 30 in the direction along which the mesa structure stretches.

Figure 5:
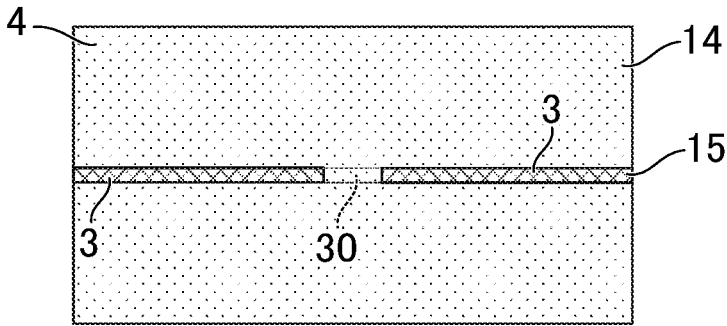
FIG. 5 is a schematic sectional view taken along the line V-V of the semiconductor laser illustrated in FIG. 4.

FIG. 5 is a schematic sectional view taken along the line V-V of FIG. 4, and is a view of a section of the insulating film 14 viewed from above. In order to simplify the description, the facet coating film 4 on each of the two facets is not illustrated. The mesa structure 15 is indicated by the dotted lines for the same reason. As shown in FIG. 5, in a region in which the phase shift portion 13 may be placed, the highly resistive element 30 (here, the insulating film 14) may be placed and, in this region, the contact layer 10 of the second-conductivity type, which may be a topmost layer of the mesa structure 15, and the second electrode 3 may not be electrically connected to each other. Accordingly, minimal (if any) current flows into the phase shift portion 13. That is, a very minute amount of current may flow into the phase shift portion 13 via the cladding layer 9 of the second-conductivity type, but the phase shift portion 13 may be low in current density compared to the region in which the insulating film 14 is not placed.

In some implementations, the DFB laser including the phase shift portion increases in photon density around the phase shift portion and, in a region in which the photon density is high, decreases in carrier density due to stimulated emission. The decrease in carrier density resulting from an increase in photon density may be described by Formula (2) obtained by setting a steady state as dn/dt=0 in Formula (1), which may be a rate equation describing a rate of change of the carrier density. When the gain is positive, a numerator of a second term of Formula (2) is positive as well. Lowering of a current density J is accordingly effective to suppress the decrease in carrier density due to the increased photon density.

$$\frac{dn}{dt} = \eta_i \cdot \frac{J}{qd} - \frac{C_0}{n_{\mathit{eff}}} \cdot \frac{dg}{dn}(n - n_0)S - \frac{n}{\tau_N} \tag{1}$$

n: carrier density
$\eta_i$: internal differential quantum efficiency
J: current density
q: unit charge amount
d: active layer thickness
$C_0$: photon speed in vacuum
$n_{\mathit{eff}}$: refractive index
dg/dn: differential gain
$n_0$: transparent carrier density
S: photon density
$\tau_N$: carrier lifetime $$n = n_0 + \frac{\eta_i \cdot \dfrac{J}{qd} - \dfrac{n_0}{\tau_N}}{\dfrac{C_0}{n_{\mathit{eff}}} \cdot \dfrac{dg}{dn} \cdot S + \dfrac{1}{\tau_N}} \tag{2}$$

In the semiconductor laser 1 according to the first example implementation, the highly resistive element 30 is placed between the second electrode 3 and the contact layer 10 of the second-conductivity type in order to lower the current density in a region around the phase shift portion 13, which is a region high in photon density. The highly resistive element 30 causes the current density around the phase shift portion 13 to drop, thereby suppressing the lowering of the carrier density due to the increase in photon density. As a result, the hole burning effect is suppressed and deterioration of characteristics of the semiconductor laser 1 can be suppressed. A region in which the hole burning effect occurs may vary, depending on a reflectance of the coating film on each of the two facets, and a position of the phase shift portion. However, in the semiconductor laser 1 according to the first example implementation, the two facets each may have a coating film of low reflectance, the phase shift portion 13 may be placed around a center of a resonator length (here, a length between the two facets), and the magnitude of the hole burning effect may be consequently large in the phase shift portion 13. The hole burning effect can accordingly be suppressed by lowering the current density of the phase shift portion 13. A desired placement of the phase shift portion may be at a point between 40% and 60% of the length from the front facet to the back facet.

The grating layer 11 in the first example implementation adopts a grating structure called "a floating type." A floating type grating may be structured so that, inside a semiconductor layer (e.g., the cladding layer 9 of the second-conductivity type in the first example implementation), regions different from the semiconductor layer in refractive index may be arranged side by side at fixed intervals. That is, the grating layer 11 may have a structure in which the cladding layer 9 of the second-conductivity type and a semiconductor layer (high refractive index layer) having a refractive index higher than that of the cladding layer 9 may be arranged in an alternating pattern. The λ/4 shift structure employed in the first example implementation may be a structure in which the cladding layer 9 of the second-conductivity type or the high refractive index layer appears continuously in one region. That is, the grating layer 11 may have a structure in which the cladding layer 9 of the second-conductivity type that may have a fixed length and the high refractive index layer of a fixed length may be arranged at fixed intervals in an alternating pattern, but, in the phase shift portion 13, the cladding layer 9 of the second-conductivity type or the high refractive index layer that has a length different from the fixed length is placed. The grating is not limited to the floating type. For example, a grating may be formed by forming concavities and convexities in a top surface of the SCH layer 8 of the second-conductivity type.

The grating period of the grating layer 11 varies depending on oscillating frequency, but may be several hundred nanometers, for example. When emitted light is to oscillate in, for example, a 1.3 μm-band, the grating period may be approximately 200 nm. In this case, the phase shift portion 13 may have a period (a distance from a left edge of a high refractive index portion to a left edge of an adjacent high refractive index portion to the right of the former high refractive index portion) of approximately 300 nm. The hole burning effect may be centered at the phase shift portion 13 and also affects a surrounding region that may be at a certain distance from the phase shift portion 13. In addition, a current injected into the second electrode 3 disperses within the cladding layer 9 of the second-conductivity type. A width of the highly resistive element that may be effective for suppression of the hole burning effect may be accordingly wider than the phase shift portion in the direction along which the mesa structure stretches. For example, a satisfactory effect of suppressing the hole burning effect may be obtained by setting the width of the highly resistive element 30 in the direction along which the mesa structure 15 stretches to 10 μm or more. However, 10 μm is an example, and the width of the highly resistive element 30 is not limited thereto. An effect of suppressing the hole burning effect can be obtained when the highly resistive element 30 is placed so as to cover an extent wider than at least the phase shift portion 13.

A method of manufacturing the semiconductor laser is now described. First, a publicly-known multilayer growth technology and a publicly-known lithography technology may be used to form, on the substrate 5, the optical confinement layer 6 of the first-conductivity type, the active layer 7, the optical confinement layer 8 of the second-conductivity type, the cladding layer 9 of the second-conductivity type including the grating layer 11, and the contact layer 10 of the second-conductivity type. The grating layer 11 may include the phase shift portion 13. An oxide film mask may be formed in a region that is to become the mesa structure 15. Sides to the left and right of the region to become the mesa structure 15 may be then removed with use of photolithography technology. Next, the mask on the mesa structure 15 may be removed after the buried layer 12 is formed through epitaxial growth by MOCVD. Next, the insulating film 14 including the highly resistive element 30 higher in electric resistance than the contact layer 10 of the second-conductivity type may be formed on the entire surface. Out of the insulating film 14 formed on the entire surface, only a portion of the insulating film 14 that is formed in a region in which the contact layer 10 of the second-conductivity type and the second electrode 3 may be in contact with each other may be removed with use of the photolithography technology (see FIG. 5). Next, a film may be formed on the entire surface from materials of the second electrode 3, which may be formed of, for example, Ti/Pt/Au, and the materials of the second electrode 3 may be removed from regions other than the region of the second electrode 3 illustrated in FIG. 1. Next, the substrate 5 may be processed so as to have a desired thickness, and then the first electrode 2 may be formed on the rear surface, to thereby complete the semiconductor laser. According to the steps described above, the highly resistive element 30 may be placed below at least a part of a portion of the second electrode 3 that overlaps with the phase shift portion 13. The second electrode 3 may be accordingly not in contact with the contact layer 10 of the second-conductivity type in the region in which the highly resistive element 30 is formed, with the result that the hole burning effect is suppressed.

Figure 6:
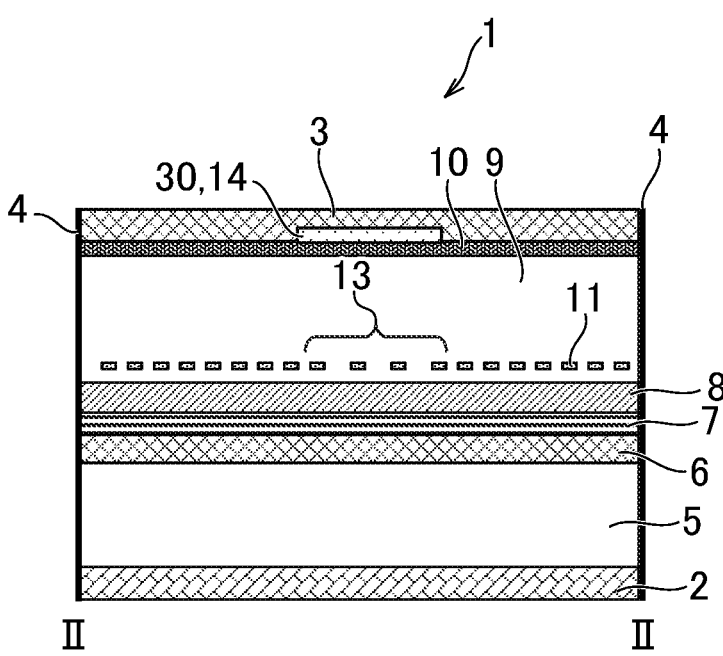
FIG. 6 is a schematic sectional view taken along the line II-II of a semiconductor laser according to Modification Example of the first example implementation.

FIG. 6 is a schematic sectional view taken along the line II-II of the semiconductor laser 1 according to a Modification Example of the first example implementation. A difference from the first example implementation is that the grating has a corrugation-pitch-modulated (CPM) structure. The CPM structure may be a structure in which the grating period varies in one region. The region in which the grating period varies may be adjusted in grating period and region length over which the region is placed (in the direction along which the mesa structure 15 stretches) in order to attain a desired shift amount. In the Modification Example, the region may be adjusted so that the phase is shifted by λ/4. The phase shift portion 13 may be defined by the region in which the grating period varies.

In the Modification Example as well, the highly resistive element 30 may be placed in the region overlapping with the phase shift portion 13. Here, the highly resistive element 30 may be the insulating film 14. The current density in the phase shift portion 13 accordingly drops, with the result that the hole burning effect may be suppressed. A desired width of the highly resistive element 30 overlapping with the phase shift portion 13 may be wider than the phase shift portion 13 in the direction along which the mesa structure 15 stretches. However, when the grating has the CPM structure, the phase shift portion 13 may be placed over a length of a region longer than in the case of the grating structure described in the first example implementation. Accordingly, the effects of the present invention may be obtained even when the highly resistive element 30 covers the phase shift portion 13 only partially (for example, about 80% of the CPM grating structure).

Figure 7:
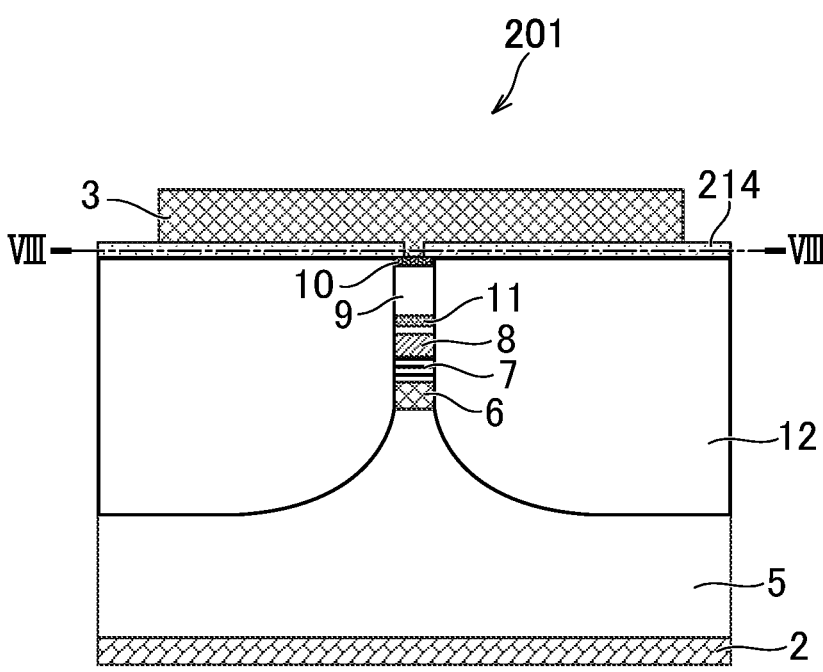
FIG. 7 is a schematic sectional view of a portion of a semiconductor laser according to a second example implementation of the present invention that is around a phase shift portion of the semiconductor laser.
Figure 8:
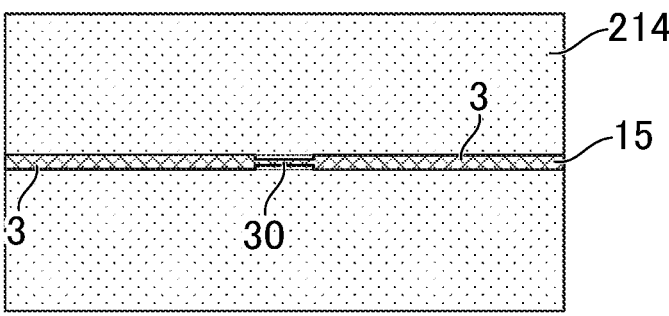
FIG. 8 is a schematic sectional view taken along the line VIII-VIII of the semiconductor laser illustrated in FIG. 7.

FIG. 7 is a schematic sectional view of a semiconductor laser 201 according to a second example implementation of the present invention. FIG. 7 is a sectional view of the same region as the region of FIG. 4 of the first example implementation (a sectional view at the position of the phase shift portion 13). FIG. 8 is a schematic sectional view taken along the line VIII-VIII of FIG. 7. Other structures are the same as those in the first example implementation.

The second example implementation differs from the first example implementation in the structure of an insulating film 214. In the first example implementation, the highly resistive element 30 completely covers a portion above the phase shift portion 13. In the second example implementation, on the other hand, the highly resistive element 30, which may be a part of the insulating film 214, does not completely cover the phase shift portion 13, and the second electrode 3 may be in contact with the contact layer 10 of the second-conductivity type above the phase shift portion 13 as well. The insulating film 214 may be accordingly structured so that a current flows into the phase shift portion 13 as well. That is, the highly resistive element 30 partially covers the portion above the phase shift portion 13. As a result, around the phase shift portion 13, a region in contact with the second electrode 3 may be narrower than in regions in front of and behind the phase shift portion 13. Owing to this structure, the current flowing in the phase shift portion 13 may be smaller than in the other regions, and the current density may be accordingly low. An effect of suppressing the hole burning effect can thus be obtained also in the second example implementation. In this manner, the hole burning effect can be suppressed also when the phase shift portion 13 is not completely covered with the highly resistive element 30.

Figure 9:
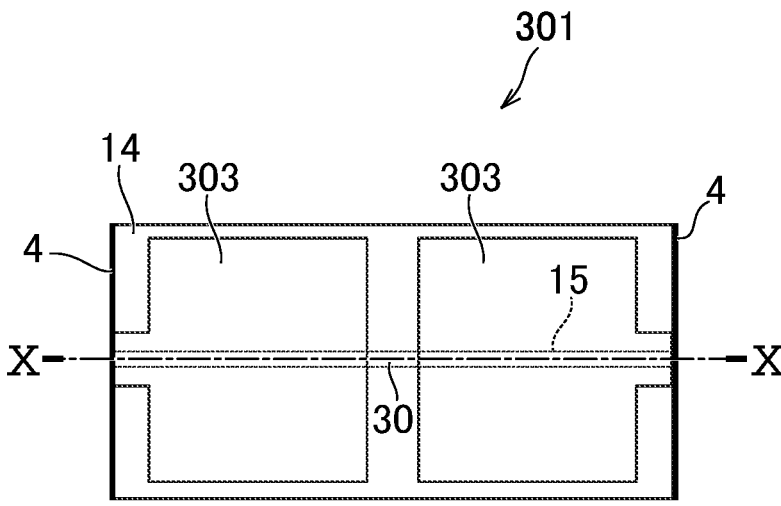
FIG. 9 is an example of a top view of a semiconductor laser according to a third example implementation of the present invention.
Figure 10:
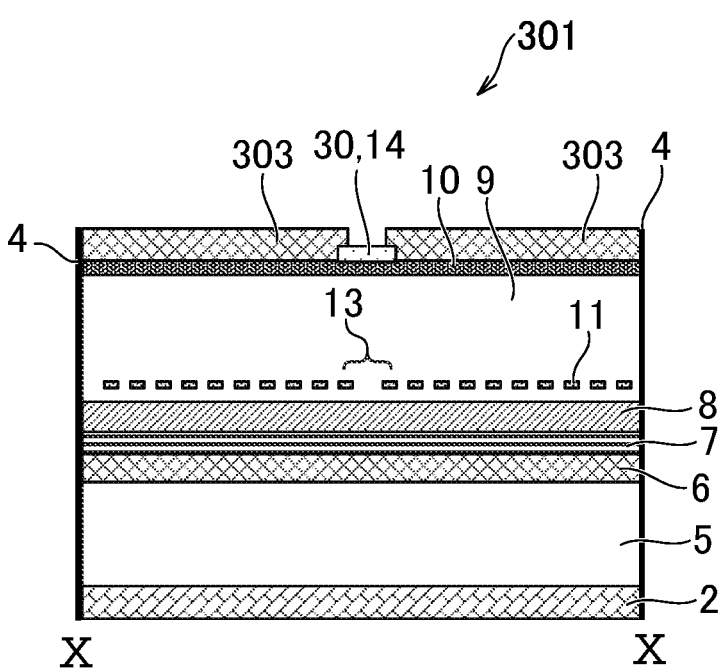
FIG. 10 is a schematic sectional view taken along the line X-X of the semiconductor laser illustrated in FIG. 9.

FIG. 9 is a top view of a semiconductor laser 301 according to a third example implementation of the present invention. FIG. 10 is a schematic sectional view taken along the line X-X of FIG. 9. A difference between the first example implementation and the third example implementation is a difference in the structure of a second electrode 303. In the third example implementation, the second electrode 303 may be divided into two sites around a region in which the phase shift portion 13 and the second electrode 303 overlap with each other. Other structures may be the same as those in the first example implementation.

As illustrated in FIG. 10, end portions of the highly resistive element 30 may overlap with the second electrode 303 also in the third example implementation. The highly resistive element 30 is also placed so as to overlap with the phase shift portion 13. In a region in which the phase shift portion 13 and the highly resistive element 30 overlap with each other, the current density of the phase shift portion 13 may accordingly be lowered. The second electrode 303 divided into two sites uses the same material and the same layer structure for the two sites. The same amount of current may be injected into the two sites of the second electrode 303. When the two sites of the second electrode 303 are separate from each other, the current density of the phase shift portion 13 may be lowered to a certain degree even without the highly resistive element 30. However, without the highly resistive element 30, the contact layer 10 of the second-conductivity type, which may be a semiconductor layer, may be exposed. A semiconductor layer exposed to the air may be affected by contamination and the like, and may consequently lead to decreased reliability of the semiconductor laser 301. In addition, in a case of junction-down mounting in which the semiconductor laser 301 is mounted with a side of the second electrode 303 facing a device mounting substrate (sub-mount), solder used in the mounting comes into contact with the region overlapping with the phase shift portion 13. In this case, a configuration without the highly resistive element 30 does not stop the solder from coming into contact with the contact layer 10 of the second-conductivity type, and the contact may invite deterioration of crystals. In the third example implementation, however, even when the two sites of the second electrode 303 are separate from each other, the problem as described above is avoidable because the highly resistive element 30 may be placed between the two sites. Although the highly resistive element 30 may be a part of the insulating film 14 in other embodiments, the highly resistive element 30 in the third example implementation may be desired to be the entirety of the insulating film 14. It may be difficult to align end portions of the second electrode 303 with the end portions of the highly resistive element 30. However, this may be accomplished by forming the second electrode 303 so that the second electrode 303 partially spills over the end portions of the highly resistive element 30.

Figure 11:
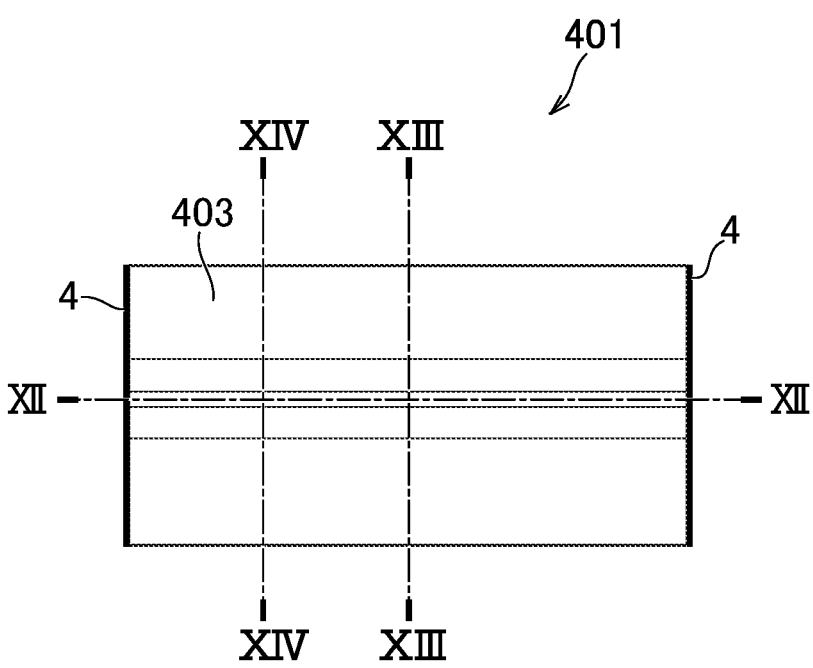
FIG. 11 is an example of a top view of a semiconductor laser according to a fourth example implementation of the present invention.
Figure 12:
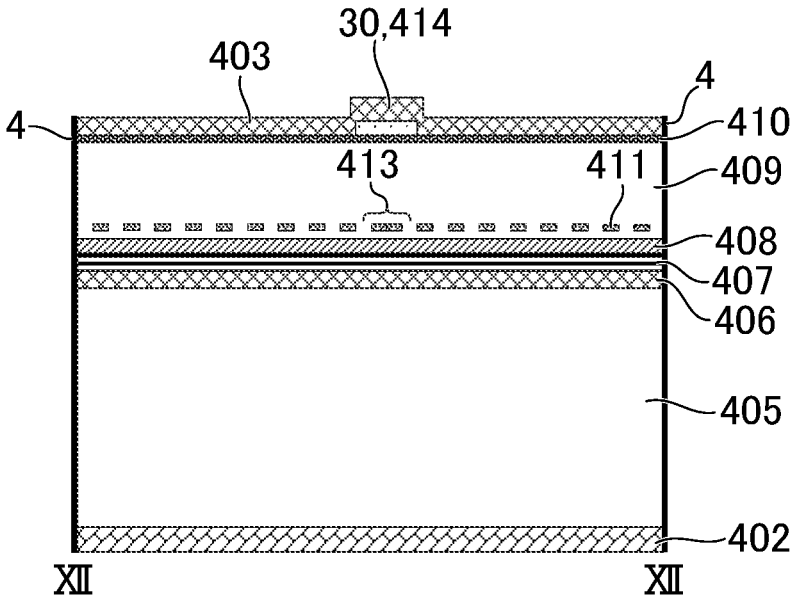
FIG. 12 is a schematic sectional view taken along the line XII-XII of the semiconductor laser illustrated in FIG. 11.
Figure 13:
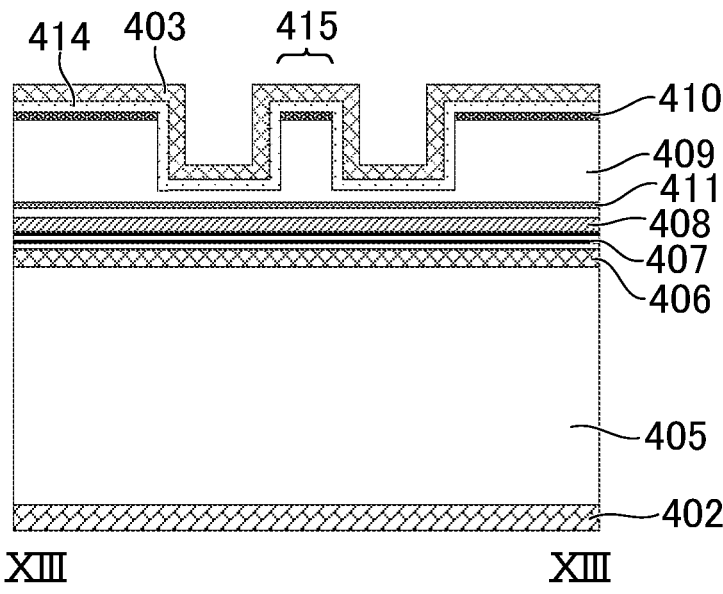
FIG. 13 is a schematic sectional view taken along the line XIII-XIII of the semiconductor laser illustrated in FIG. 11.
Figure 14:
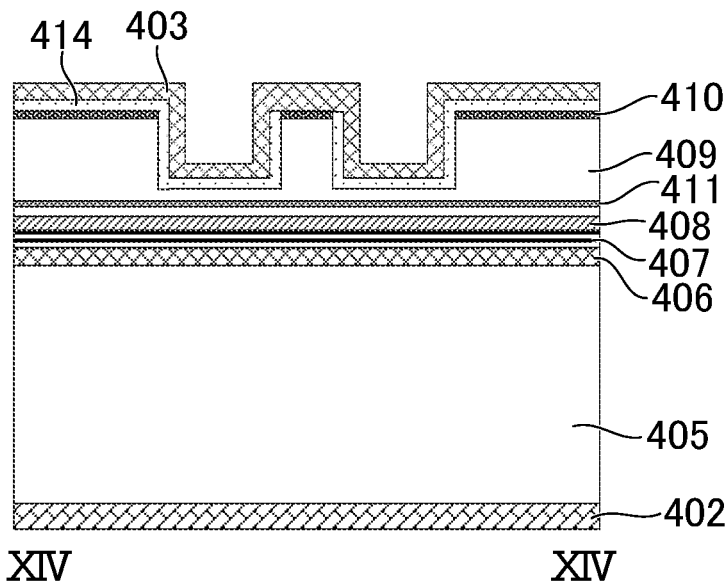
FIG. 14 is a schematic sectional view taken along the line XIV-XIV of the semiconductor laser illustrated in FIG. 11.

FIG. 11 is a top view of a semiconductor laser 401 according to a fourth example implementation of the present invention. FIG. 12 is a schematic sectional view taken along the line XII-XII of FIG. 11. FIG. 13 is a schematic sectional view taken along the line XIII-XIII of FIG. 11. FIG. 14 is a schematic sectional view taken along the line XIV-XIV of FIG. 11. The semiconductor laser 401 may include a first electrode 402 on a rear surface and may have a second electrode 403 on a front surface. The first electrode 402 and the second electrode 403 may be metal layers. Injection of a current between the first electrode 402 and the second electrode 403 causes light emission from a front facet (a facet on a left-hand side in FIG. 11). A low-reflection facet coating film 4 may be formed on each of the front facet and a back facet (a facet on a right-hand side in FIG. 11).

The semiconductor laser 401 may include an optical confinement layer (e.g., an SCH layer) 406 of the first-conductivity type, an active layer 407, an optical confinement layer (e.g., an SCH layer) 408 of the second-conductivity type, a cladding layer 409 of the second-conductivity type, and a contact layer 410 of the second-conductivity type, which may be semiconductor layers grown on a substrate 405 of the first-conductivity type in the stated order. A grating layer 411 may be formed in the cladding layer 409 of the second-conductivity type. The semiconductor laser 401 may be a DFB laser. The active layer 407 may be formed from, for example, a multiple quantum well layer. Here, the first-conductivity type may be an "n" type and the second-conductivity type may be a "p" type, but may be vice versa. A part of the cladding layer 409 of the second-conductivity type may form a mesa structure 415 together with the contact layer 410 of the second-conductivity type. The semiconductor layers below the grating layer 411 may be not included in the mesa structure 415. Bank portions of substantially the same height as the mesa structure 415 may be formed on sides to the left and right of the mesa structure 415. An insulating film 414 may be placed from top surfaces of the bank portions on the two sides to side surfaces of the mesa structure 415. On a top surface of the mesa structure 415, the insulating film 414 may be placed in a region overlapping with a phase shift portion 413 described later, and is not placed in other regions. A portion of the insulating film 414 that may be in the region overlapping with the phase shift portion 413 may be the highly resistive element 30.

The grating layer 411 may be arranged in the direction along which the mesa structure 415 stretches. The grating layer 411 may have a constant grating period, but may include the phase shift portion 413 in a substantially central portion viewed from the direction along which the mesa structure 415 stretches. The phase shift portion 413 here may be a λ/4 phase shift portion. The grating layer 411 may have a structure in which a high refractive index layer of the phase shift portion 413 is longer than high refractive index layers of other regions. In a region in which the phase shift portion 413 and the second electrode 403 overlap with each other, the insulating film 414 (highly resistive element 30) may be placed, and the current density of the phase shift portion 413 may be accordingly low. The hole burning effect can thus be suppressed.

Figure 15:
FIG. 15 is an example of a top view of a semiconductor laser according to a fifth example implementation of the present invention.
Figure 15:
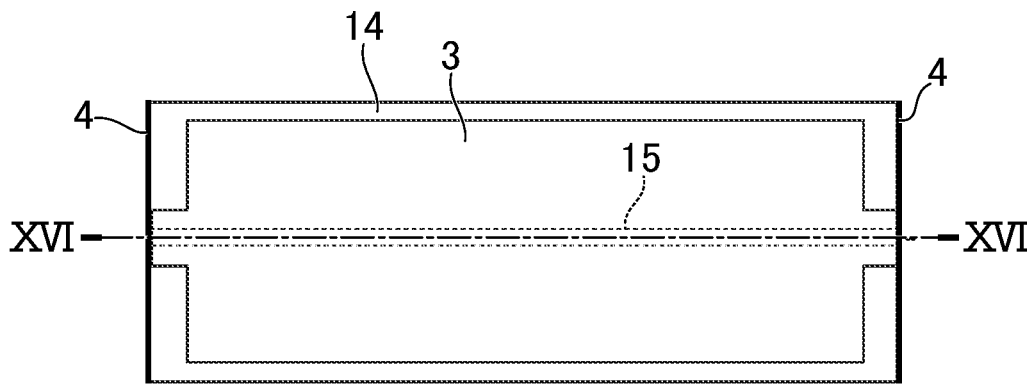
Figure 16:
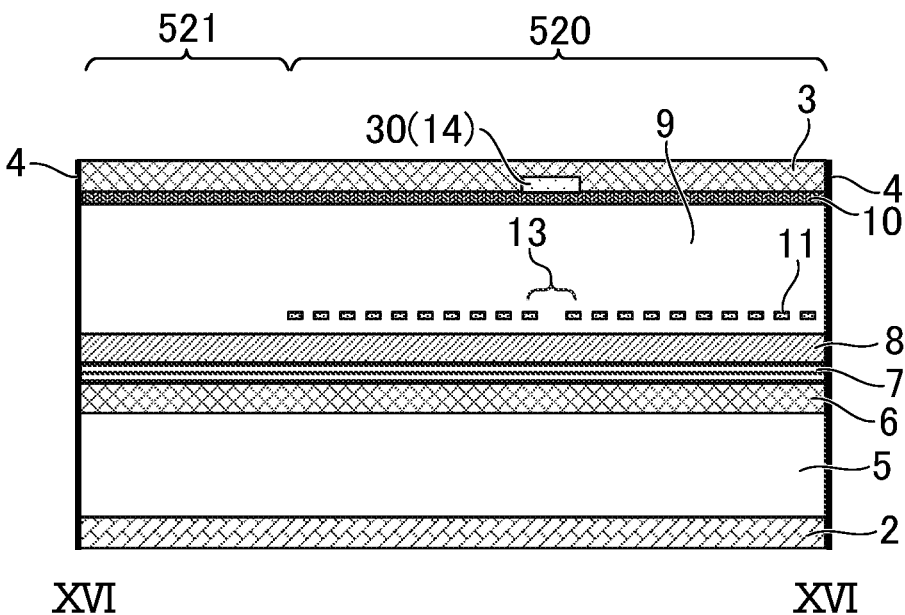
FIG. 16 is a schematic sectional view taken along the line XVI-XVI of the semiconductor laser illustrated in FIG. 15.

FIG. 15 is a top view of a semiconductor laser 501 according to a fifth example implementation of the present invention. FIG. 16 is a schematic sectional view taken along the line XVI-XVI of FIG. 15. The fifth example implementation differs from the first example implementation in that the semiconductor laser 501 may include an optical amplifier 521 on a side of a front facet (a facet on a left-hand side in FIG. 15).

In the semiconductor laser 501, a semiconductor laser portion 520 and the optical amplifier 521 may be integrated on the substrate 5 in a unitary manner. The optical amplifier 521 may have the same layer structure as the laser structure of the semiconductor laser portion 520, except that the optical amplifier 521 does not include the grating layer 11. The optical amplifier 521 amplifies light generated by the semiconductor laser portion 520.

The phase shift portion 13 may be provided in a substantially central portion of a region in which the grating layer 11 is placed, in a direction along which the mesa structure 15 stretches. The hole burning effect occurs around the phase shift portion 13 in this structure as well. For that reason, the highly resistive element 30 (here, the insulating film 14) may be placed in a region overlapping with the phase shift portion 13 as in the first example implementation. The current density around the phase shift portion 13 can thus be lowered.

In this manner, the effects of the present invention may be obtained also when another structure, which is not limited to an optical amplifier, may be included in front of the semiconductor laser portion including the grating layer. For example, a window structure may be placed. The window structure may be formed from a material having a refractive index lower than the refractive index of the active layer, and may reduce influence of reflection.

Figure 17:
FIG. 17 is an internal sectional view of a semiconductor laser according to a sixth example implementation of the present invention.
Figure 17:
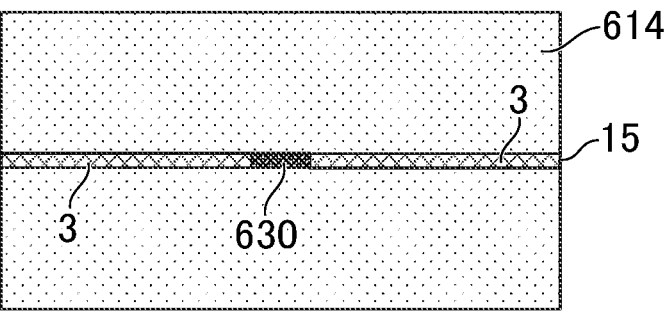

FIG. 17 is a schematic sectional view of a semiconductor laser 601 according to a sixth example implementation of the present invention, and may be a sectional view of the same region as the region of FIG. 5 of the first example implementation. In the sixth example implementation, a highly resistive element 630 is formed from a material different from a material of an insulating film 614. Other structures may be the same as those in the first example implementation.

In other embodiments, a region of the insulating film 14 that is the highly resistive element 30 and other regions of the insulating film 14 may be formed from the same material. The highly resistive element 630 in the sixth example implementation uses a material different from the material of other regions of the insulating film 614. However, the resistance of the highly resistive element 630 may be well higher than the resistance of the contact layer 10 of the second-conductivity type. Examples of the highly resistive element 630 include materials given below. First, the insulating films described in other embodiments qualify as the highly resistive element 630. The insulating film may be noted as a "film" for the sake of convenience, but may have any shape as long as the insulating film is an insulator. The highly resistive element 630 may also be an insulating film of a type different from the insulating film 614. Examples of the insulating film 614 include a silicon oxide film and a silicon nitride film. The highly resistive element 630 may also be a semiconductor high in resistance. For example, when the substrate 5 is formed of InP, the highly resistive element 630 may be undoped InP or undoped InGaAs. The highly resistive element 630 may also be InP doped with impurities and thereby increased in resistance, for example, InP doped with Fe or Ru. The highly resistive element 630 may also be a resin. Examples of the resin include polyimide resin and BCB.

The present invention is not limited to the embodiments described above, and may be receptive of various modifications. For example, the CPM structure described in the Modification Example of the first example implementation may be combined with another example implementation. The facet coating film is not limited to a low-reflection film. For example, a low-reflection coating film and a high-reflection coating film may be used for the front facet and the back facet, respectively. Although an example in which the grating layer is placed above the active layer is discussed in the embodiments described above, the effects of the present invention can be obtained also when the grating layer is placed below the active layer.

The present invention reduces axial hole burning in a DFB laser including a phase shift portion. Embodiments of the present invention accomplish the reduction by decreasing a current supplied to a high-light intensity region in an optical axis of the DFB laser. The high-light intensity region is around a phase shift region of a mesa structure. In order to decrease the current injected to that region (lower a current density of that region), the embodiments of the present invention remove a part of a second electrode that is aligned in an axial direction above the phase shift region. The removed part of the second electrode is replaced with a highly resistive element. The phase shift portion may be a continuous high refractive index layer or low refractive index layer. The DFB laser may be of a buried type (for example, a planar type) in which the mesa structure is buried, or an exposed type (for example, a ridge type) in which the mesa structure is not buried in semiconductor layers. The DFB laser may have an n-type polarity or a p-type polarity as polarity of a semiconductor layer placed on the active layer. The DFB laser may be a part of an integrated device of an amplifier-integrated semiconductor laser.

While there have been described what are at present considered to be certain embodiments of the invention, it will be understood that various modifications may be made thereto, and it is intended that the appended claims cover all such modifications as fall within the true spirit and scope of the invention.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A semiconductor laser, comprising:
an active layer;
a grating layer including a phase shift portion with partially different grating periods;
a contact layer placed above the grating layer;
a highly resistive element higher in electric resistance than the contact layer; and
an electrode in contact with the contact layer,
the highly resistive element being placed between a portion of the electrode that overlaps with the phase shift portion and a portion of the contact layer that overlaps with the phase shift portion.

2. The semiconductor laser according to claim 1, further comprising a mesa structure, the mesa structure having the contact layer as a topmost layer and stretching along a direction from which light is extracted,
wherein the electrode is in contact with the contact layer in front of and behind the highly resistive element in the direction along which the mesa structure stretches.

3. The semiconductor laser according to claim 2, wherein the highly resistive element is broader in width than the phase shift portion, in the direction along which the mesa structure stretches.

4. The semiconductor laser according to claim 2, wherein the highly resistive element is placed below a part of the portion of the electrode that overlaps with the phase shift portion.

5. The semiconductor laser according to claim 1, wherein the phase shift portion has a corrugation-pitch-modulated (CPM) structure.

6. The semiconductor laser according to claim 1, wherein the active layer is formed of an n-type semiconductor.

7. The semiconductor laser according to claim 1, further comprising an optical amplifier in a direction from which light of the active layer is extracted.

8. The semiconductor laser according to claim 1, further comprising a window structure formed of a material lower in refractive index than the active layer, in a direction from which light of the active layer is extracted.

9. The semiconductor laser according to claim 1, wherein the highly resistive element is any one of an insulator, a high-resistance semiconductor layer, or a resin.

10. The semiconductor laser according to claim 1, further comprising a low-reflection facet coating film on at least one of a front facet or a back facet, the front facet being a facet in a direction from which light is extracted, the back facet being a facet on a side opposite from the front facet.

11. The semiconductor laser according to claim 10, wherein the phase shift portion is placed at a point between 40% and 60% of a length from the front facet to the back facet.

12. A method of manufacturing a semiconductor laser, the method comprising:
forming an active layer;
forming a grating layer including a phase shift portion with partially different grating periods;
forming a contact layer above the grating layer;
forming a highly resistive element higher in electric resistance than the contact layer; and
forming an electrode in contact with the contact layer,
the highly resistive element being placed between a portion of the electrode that overlaps with the phase shift portion and a portion of the contact layer that overlaps with the phase shift portion.

13. The method of claim 12, further comprising:
forming a mesa structure having the contact layer as a topmost layer and stretching along a direction from which light is extracted,
wherein the electrode is in contact with the contact layer in front of and behind the highly resistive element in the direction along which the mesa structure stretches.

14. The method of claim 13, wherein the highly resistive element is broader in width than the phase shift portion, in the direction along which the mesa structure stretches.

15. The method of claim 12, wherein the highly resistive element is placed below a part of the portion of the electrode that overlaps with the phase shift portion.

16. The method of claim 12, wherein the phase shift portion has a corrugation-pitch-modulated (CPM) structure.

17. The method claim 12, wherein the highly resistive element is encapsulated by the electrode.

18. A semiconductor laser, comprising:

an active layer;

a grating layer including a phase shift portion with partially different grating periods;

a contact layer placed above the grating layer;

a highly resistive element higher in electric resistance than the contact layer; and an electrode in contact with the contact layer, the highly resistive element being below at least a part of a portion of the electrode that overlaps with the phase shift portion, and the highly resistive element being encapsulated by the electrode.

19. The semiconductor laser of claim 18, wherein the highly resistive element is above a portion of the contact layer that overlaps with the phase shift portion.

20. The semiconductor laser of claim 18, wherein the phase shift portion has a corrugation-pitch-modulated (CPM) structure.

\* \* \* \* \*